(12) United States Patent
Kyllingstad

(10) Patent No.: US 10,358,904 B2
(45) Date of Patent: Jul. 23, 2019

(54) METHODS AND SYSTEMS FOR CONTROL OF WELLBORE TRAJECTORIES

(71) Applicant: NATIONAL OILWELL VARCO NORWAY AS, Kristiansand S (NO)

(72) Inventor: Åge Kyllingstad, Ålgård (NO)

(73) Assignee: National Oilwell Varco Norway AS (NO)

( * ) Notice: Subject to any disclaimer, the term of this patent is extended or adjusted under 35 U.S.C. 154(b) by 171 days.

(21) Appl. No.: 15/114,703

(22) PCT Filed: Jan. 27, 2015

(86) PCT No.: PCT/NO2015/050016
§ 371 (c)(1),
(2) Date: Jul. 27, 2016

(87) PCT Pub. No.: WO2015/112024
PCT Pub. Date: Jul. 30, 2015

(65) Prior Publication Data
US 2016/0341027 A1    Nov. 24, 2016

Related U.S. Application Data

(60) Provisional application No. 61/931,851, filed on Jan. 27, 2014.

(51) Int. Cl.
*G06N 3/08* (2006.01)
*E21B 44/04* (2006.01)
(Continued)

(52) U.S. Cl.
CPC ............ *E21B 44/04* (2013.01); *E21B 7/04* (2013.01); *E21B 7/06* (2013.01); *E21B 7/10* (2013.01);
(Continued)

(58) Field of Classification Search
USPC .............................................. 175/24, 27, 54
See application file for complete search history.

(56) References Cited

U.S. PATENT DOCUMENTS 4,697,651 A    10/1987    Dellinger
5,465,799 A    11/1995    Ho
(Continued)

FOREIGN PATENT DOCUMENTS

| WO | WO2011130159 | 10/2011 |
|----|--------------|---------|
| WO | 2015112024   | 7/2015  |

OTHER PUBLICATIONS

Written Opinion for PCT/NO2015/050016 (undated) (9 pages).
NOV mud motor handbook.

*Primary Examiner* — Lam S Nguyen
(74) *Attorney, Agent, or Firm* — Conley Rose, P.C.

(57) ABSTRACT

There are described methods for controlling the direction of a wellbore trajectory during directional sliding drilling by means of a drill string having a drill bit rotatable, by means of a mud motor, around a drill bit rotation axis at its lower end, the direction of the drill bit rotation axis defining a tool face, wherein one of the methods comprises the following steps:
  a2) obtaining data indicative of the torque of the mud motor; and
  b2) calculating a reactive twist angle of the drill string by multiplying the obtained torque from step a2) by the torsional drill string compliance, wherein the method further comprises the step of:
  c2) rotating the drill string, by means of a drill string rotation means, an angle substantially equal to but in the opposite direction of the calculated reactive twist angle.

(Continued)

There are also described systems for executing the methods as well as computer program products comprising instructions for causing a processor to perform the methods as described herein.

15 Claims, 5 Drawing Sheets

(51) Int. Cl.
    *E21B 7/04*         (2006.01)
    *E21B 7/10*         (2006.01)
    *E21B 7/06*         (2006.01)
    *E21B 47/12*       (2012.01)
    *G06F 17/50*       (2006.01)

(52) U.S. Cl.
    CPC .......... *E21B 47/12* (2013.01); *G06F 17/5086* (2013.01)

(56) References Cited

U.S. PATENT DOCUMENTS

| | | |
|---|---|---|
| 2009/0090555 A1 | 4/2009 | Boone |
| 2012/0018218 A1 | 1/2012 | Rosenhauch |

METHODS AND SYSTEMS FOR CONTROL OF WELLBORE TRAJECTORIES

CROSS-REFERENCE TO RELATED APPLICATIONS

The present application is a 35 U.S.C. § 371 national phase application of PCT/NO2015/050016 with international filing date of Jan. 27, 2015, and claim priority thereto, and further claim priority to provisional application no. U.S. 61/931,851 filed Jan. 27, 2014. Each of the above-identified application is incorporated herein by reference in its entirety for all purposes.

STATEMENT REGARDING FEDERALLY SPONSORED RESEARCH OR DEVELOPMENT

Not applicable.

The present disclosure relates to a method for improved control of wellbore trajectories while improving the penetration rates during sliding drilling.

BACKGROUND

Most of the oil and gas wells drilled today are directional wells, meaning that their trajectory and target(s) depart substantially from a straight vertical well. A well trajectory is often described by a so-called survey table listing how the inclination and azimuth angles vary with measured depth. Inclination is the angular deviation from vertical, azimuth refers to the geographic direction, and measured depth refers to the along hole arc length from a selected datum position at the surface. Targets and wellbore trajectories may also be described by Cartesian coordinates, normally called northing, easting, and vertical depth.

Directional drilling is the technique of drilling a well so that its path closely follows the planned wellbore trajectory. Poor directional control can lead to many problems, such as reduced production rates of hydrocarbons when the target is missed, and excessive friction (torque and drag) if the wellbore is not smooth but crooked with a high tortuosity. Since time and costs are important factors in drilling, the challenge in directional drilling is to combine accurate trajectory control with a high rate of penetration.

There are several techniques for controlling the wellbore path during drilling. A relatively new group of systems, called rotary steerable systems (RSS), have in common that they provide directional control while rotating the string. Because these systems are quite sophisticated and expensive, they still have a limited marked share.

A common method, which has been used for many decades and is still widely used because of its relatively low cost, is sliding drilling with a steerable motor assembly. As the name indicates, this is a technique where the string is not rotated but slid into the well as the bit penetrates the formation. The bit is powered and rotated by a mud motor which can be either a positive displacement motor or a turbine motor driven by the drilling fluid pumped through the drill string. Directional control is provided by a bend often integrated in the motor housing. The direction of the bend, and of the bit rotation axis, is called the tool face. In a vertical wellbore section, the tool face determines the geographic azimuth direction, while in a deviated wellbore section, the tool face represents a vector, like the small handle of a circular watch. As two examples, a tool face pointing upwards (12 o'clock position) will build (increase) the inclination without changing the azimuth direction, while the 9 o'clock tool face position represents a pure left turn. Tool face is therefore a unit vector describing the desired direction of the wellbore curvature, perpendicular to the current tangent vector of the wellbore axis. The magnitude of the curvature depends on many variables, such as the bend angle, the distance from the bit to the bend, stabilizer positions, the flexural rigidity of the bottom hole assembly (BHA) and even the tool face.

Sliding drilling is most often used together with a measurement-while-drilling (MWD) tool placed above and close to the drilling motor. This MWD tool measures, by means of accelerometers and magnetometers, the inclination and the azimuth angles of the tool itself, and the tool face angle. These measurement data are normally transmitted to surface by mud pulse telemetry to provide the necessary feedback to the directional driller, who is the person responsible for keeping the wellbore close to the planned trajectory. The low transmission bandwidth provided by mud pulse telemetry makes the measurement rates relatively slow, typically one measurement per 30 seconds.

A special challenge with sliding drilling is the reactive twist of the string arising from a typical bit torque. As an example, a 3000 m long section of standard 5-inch drill pipes exposed to a typical bit torque of 5 kNm is twisted about 2.4 turns. This implies that a relatively small change in bit torque can cause a significant and undesired change in the tool face. The wellbore friction along the string will hinder an immediate twist response, but after some time, typically 1-30 minutes but strongly dependent on the penetration rate and the string length, the axial motion of the string will cause the new bit torque to progress up the string. The tool face, the total twist, and the average string torque will asymptotically reach their equilibrium values. The dynamics of this reactive twist is discussed in some detail below.

Common practice today is that when the directional driller has established a desired and stable tool face, the driller controls the tool face indirectly by a differential pressure control. This is a well-known technique utilizing the fact that the pressure drop across the mud motor is nearly proportional to the motor torque load. An increase of the mud motor pressure will, after some time delay, be seen at the surface as an increase of the pump pressure. The pump pressure is most often measured at the standpipe at rig floor but it is approximately equal to the pump discharge pressure. When a drop in this pump pressure is observed, the string is lowered to give a higher bit load and thereby also a higher torque and pressure drop across the mud motor. Bit load is here defined as the mechanical compression force between the bit and the formation, commonly called weight on bit (WOB) in the drilling industry. Similarly, bit torque denotes the resulting torque between bit and formation, commonly called torque on bit (TOB).

There exist several automatic control systems, called diff-P auto drillers, which control the string motion in a way that keeps the differential pump pressure fairly constant and close to a set point value.

The main drawbacks of common practice of controlling tool face by sliding drilling are:

The possibilities for increasing the bit load and improving the drilling rate is very limited, because tool face often has the highest priority. This limitation often leads to a poor overall drilling rate, much lower than drilling rates obtained during the rotary drilling mode.

The resulting wellbore curvature produced by a constant tool face is often higher than maximum curvature of the planned trajectory, to provide a necessary regulation margin. To keep the wellbore close to the planned trajectory the driller must therefore toggle between sliding mode and rotary mode. In the latter case the drill string is rotated at a relatively high speed to nullify the directional effect of the tool face.

The toggling between sliding and rotary modes deteriorates the wellbore smoothness, especially if the toggling depth intervals are long.

It often takes a long time to establish a correct and stable tool face in the sliding mode after a rotary session and after a connection when a new piece of pipe is added to the string.

High and variable axial wellbore friction makes it difficult to control the bit load and the bit torque from surface. In order to avoid high load peaks with a resulting risk of overloading and stalling of the mud motor, the average bit load must be kept relatively low, substantially lower than the bit and mud motor capacity.

In the rotary mode, the bit gets a higher speed equal to the sum of the string and the mud motor rotation speeds. This increased bit speed only partially explains why the rotary mode most often produces much higher rates of penetration than the sliding mode. The most important explanation is that rotary drilling allows a higher and better-controlled bit load.

Exemplary embodiments of the claimed invention are disclosed in the description below. The invention is defined by the claim which follow the description.

BRIEF DESCRIPTION OF THE DRAWINGS

The figures discussed in the following, and in particular FIGS. 1 and 3, are shown schematically and simplified. The various features in the drawings may not be drawn to scale.

DETAILED DESCRIPTION OF DISCLOSED EXEMPLARY EMBODIMENTS

Figure 1:
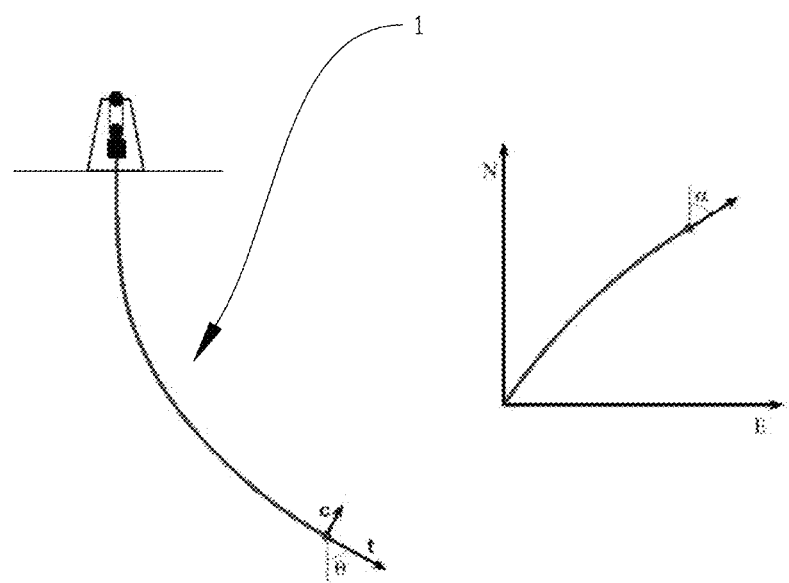
FIG. 1 shows a schematic vertical projection (left) and horizontal (North-East) projection of a wellbore trajectory.

There is described a first method for controlling the direction of a wellbore trajectory during directional sliding drilling by means of a drill string having a drill bit rotatable, by means of a mud motor, around a drill bit rotation axis at its lower end, the direction of the drill bit rotation axis defining a tool face, and the method comprising the following steps:
  a1) estimating a pressure drop across the mud motor by measuring a drilling fluid pressure;
  b1) utilizing the estimated pressure drop from step a1) to calculate the torque of the mud motor; and
  c1) calculating a reactive twist angle of the drill string by multiplying the calculated torque from step b1) by the torsional drill string compliance, wherein step a1) further comprises the step of including any transient drilling fluid pressure in the estimate.

Here and throughout this disclosure, the phrases drilling fluid pressure and pump pressure mean the circulation pressure of the drilling fluid, typically measured either at the outlet of the main circulation pumps, at the stand pipe or at the top of the string.

There is also described a system for controlling the direction of a wellbore during directional drilling, the system comprising a control unit adapted to execute the first method described above. A person of ordinary skill in the art will understand that such a system, and any other system described herein, implicitly also will comprise components for performing the directional sliding drilling, some of which may be optional. Such components may include a downhole mud motor with an integrated bend, downhole measurement while drilling (MWD) tools, drill string moving means such as a top drive suspended from a draw-works and means for sensing hook load and position, drilling fluid pumps and means for measuring drilling fluid flow rate and pressure, means for sensing drill string torque and angular position, etc.

There is also described a computer program product comprising instructions for causing a processor to perform the first method described above. The processor may be included in a control unit as the one described above.

There is also described a second method for controlling the direction of a wellbore trajectory during directional sliding drilling by means of a drill string having a drill bit rotatable, by means of a mud motor, around a drill bit rotation axis at its lower end, the direction of the drill bit rotation axis defining a tool face, and the method comprising the following steps:
  a2) obtaining data indicative of the torque of the mud motor; and
  b2) calculating a reactive twist angle of the drill string by multiplying the obtained torque from step a2) by the torsional drill string compliance, wherein the method further comprises the step of:
  c2) rotating the drill string, by means of a drill string rotation means, an angle substantially equal to but in the opposite direction of the calculated reactive twist angle.

There is also described as system for controlling the direction of a wellbore trajectory during directional drilling, the system comprising a control unit adapted to execute the steps of described second method.

In addition, there is described a computer program product comprising instructions for causing a processor to perform the described second method. The processor may be included in a control unit.

There is also described a third method for controlling the direction of a wellbore trajectory during directional sliding drilling by means of a drill string having a drill bit rotatable, by means of a mud motor, around a drill bit rotation axis at its lower end, the direction of the drill bit rotation axis defining a tool face, wherein the method comprises the following step: a3) rotating the tool face around a set direction so as to reduce the magnitude of the curvature of the wellbore.

Further there is described a system for controlling the direction of a wellbore trajectory during directional drilling, the system comprising a control unit adapted to execute the steps described third method.

Finally, there is described computer program product comprising instructions for causing a processor to perform the described third method. The processor may be included in a control unit.

The three methods described above may be summarized as follows:

1. Calculation of the torque of the mud motor from measurements and an improved estimate of the drilling fluid pressure based on an advanced hydrodynamic model including any transient drilling fluid pressure and/or flow rates and optionally also drilling fluid pressure response time.
2. Instant, and optionally also delayed, twist compensation of the drill string from the top drive so as to substantially counteract twist induced by changing drill bit torque so as to keep a more stable tool face. The twist compensation may be based on the calculated torque in the first method, but it does not have to. Alternatively it may also be based on torque measured downhole and transmitted to the surface, the latter being a viable option as high transmission bandwidth MWD communication, such as inductive communication via the drill string, is becoming commercially available.
3. Controlled variation of the tool face around a set point so as to reduce the magnitude of the wellbore curvature. This latter method may be used in combination in one or both of the other methods, but it may equally well be used as an independent method constituting a significant improvement over today's toggling between sliding and rotating drilling.

The goal for the directional driller is to keep the well trajectory close to the planned trajectory and to drill as fast as possible without creating problems that can harm the drill string components or the well quality. This goal may conveniently be split into the following two sub-goals.

Controlling the tool face fast and accurately, while simultaneously allowing changes of pump rate and/or bit load for optimizing the penetration rate, thus utilizing the first and second methods described above.

Varying the tool face in a way that controls both the direction and magnitude of the wellbore curvature, thus utilizing the third method described above.

These sub-goals may be achieved by six steps described below as an exemplary embodiment, though the invention is defined by the claim that follow this description. The first five steps concerns the first sub-goal while the last step targets the second sub-goal. The first four steps together describe a new control feature that may be defined as twist compensation and regarded as a feed-forward coupling. In short, the reactive string twist calculated from string compliance and the estimated mud motor torque is used for rotating the top of the string such that the reactive rotational motion of the motor/tool face is counter-acted.

The steps described below describe non-limiting, exemplary embodiments combining all three methods described above. It should be emphasized that the three first steps below belongs to the first method described, the fourth step and optionally the fifth step belong to the second method, whereas the sixth step belongs to the third method. Two or three of different methods may be combined, or each method may be utilized separately from the other methods.

The steps 1 and 2 below are necessary steps in the cases when no direct bit torque measurements are available, the most common situation today. However, if bit torque data are available, either from a non-standard MWD system or from a high rate wired pipe telemetry system, steps 1 and 2 below may be skipped. Low-rate downhole torque data may also be used in combination with the surface-based estimate to provide automatic model tuning and improved accuracy of the bit torque.

Step 1: Calculate Differential Pressure Across the Mud Motor

This step requires some level of simplification of the pressure loss calculations. In general, a more sophisticated and complex hydraulic model will give a more accurate estimate of the mud motor pressure drop. The simplest approach, most often used today, neglects compressibility effects and assumes that the flow rate through the entire flow loop is constant and independent of changes in the motor load, that is, $Q=Q_0$. Then the reference pressure just equals the test pressure $P_0$ observed during a calibration test with a pump rate $Q_0$ and the bit is off-bottom. The differential pressure across the motor when the mud motor is loaded is then approximated by the differential pump pressure $P-P_0$.

Here we shall advance two steps further and include both compressibility effects and the possibility of changing the pump rate after the off-bottom calibration test is completed. A first order correction of these effects can be taken into account by assuming the total pump pressure can be expressed by the following equation.

$$P = P_m + P_s - \tau_p \dot{P} \quad (1)$$

Here $P_m$ represents the pressure drop across the mud motor, $P_s$ represents the steady state pressure drop in the remaining parts of the flow loop (mainly inside the drill string and through the bit nozzles), $\tau_p$ is a pressure response time, and $\dot{P}$ is the time derivative of the pump pressure. Commonly used pressure loss models as well as field experience have shown that the steady state losses in the string and through the bit nozzles can be fairly well approximated by a power law model expressed as $$P_s = \left(\frac{Q}{Q_0}\right)^\varepsilon P_0 \quad (2)$$

Here $Q$ is the pump rate and $\varepsilon$ is a pressure exponent, with typical values between 1.5 and 2. This exponent can be determined either experimentally or theoretically. If the off-bottom tests include two steady state pressures $P_0$ and $P_1$ recorded at the different flow rates $Q_0$ and $Q_1$, respectively, then the experimental pressure exponent just equals $$\varepsilon = \frac{\ln(P_1/P_0)}{\ln(Q_1/Q_0)} \quad (3a)$$

The theoretical approach for determining this exponent requires that every major part of the total pressure loss in the flow loop is known and can be expressed analytically or numerically by look-up tables, that is, $P_s(Q)=\Sigma_i P_{s,i}(Q)$. Then the pressure exponent can be formally expressed by $$\varepsilon = \frac{Q}{P_s} \frac{dP_s}{dQ} \quad (3b)$$

The pressure response time constant is proportional to the fluid compressibility, which causes the inner string volume to act as a cushion volume containing a fluid mass that varies with pressure. Also the pressure response time can be determined either experimentally or theoretically. If the string is off-bottom ($P_m=0$), it can be written as $$\tau_p = \frac{P_s - P}{\dot{P}} \approx \frac{1}{P_1 - P_0} \int_{t_0}^{t_1} (P_s - P) dt \quad (4a)$$

The integration-based approximation is valid if $\tau_p$ is constant and independent of flow rate and pressure. If it is not a constant but a slowly varying function of P and Q, then the last approximation is still a useful approximation for the mean values of the same variables. It can be seen that an approximate, theoretical expression for this time constant is $$\tau_p = (1 - 0.5 \cdot \sigma) \kappa V_i \frac{P}{Q} \quad (4b)$$

where $\sigma$ is the ratio of drill pipe pressure drop to the total pressure drop, $\kappa$ is the fluid compressibility, and $V_i$ is the inside volume of the drill string. The first factor (inside the parenthesis), which is less than unity, accounts for the fact that the flow-induced pressure is not constant inside the drill string but decreases linearly with measured depth. This formula shows that the pressure response time is not constant but varies proportionally to $P/Q \approx (P_0/Q_0)(Q/Q_0)^{\varepsilon-1}$. This knowledge can be used to make a better experimental estimate of the pressure response time:

$$\tau_p \approx \tau_{p0} q^{\varepsilon-1} = \frac{1}{p_1 - 1} \int_{t_0}^{t_1} (q^\varepsilon p^{-1} - 1) q dt \cdot q^{\varepsilon-1} \quad (4c)$$

Here $q=Q/Q_0$ and $p=P/P_0$ are normalized flow rate and pump pressure, respectively.

An alternative method of determining the pressure time constant is discussed below, in the section discussing other improvements.

Having established realistic values for the exponent and the pressure response time, the differential pressure across the mud motor can be found by combining equations (1) and (2):

$$P_m = P - q^\varepsilon P_0 + \tau_p \dot{P} \quad (5)$$

This is an improved expression that simplifies to $P_m = P - P_0$ for steady state conditions and when $Q=Q_0$. The derivative term in the above formula must be used with some caution because the pump pressure signal normally has some high frequency components that are very much amplified in the time derivative process. The time differentiation of the pump pressure may therefore be accompanied by a low pass filter that effectively removes or dampens frequency components above a relatively low cut-off frequency.

Step 2: Calculate Mud Motor Torque

A positive displacement type mud motor has, according to the manufacturers, a linear relation between applied torque and pressure drop. Its characteristics are often given by a rated torque load, $T_{max}$ and a corresponding maximum pressure drop, $P_{max}$. The mud motor torque load at any pressure drop below this maximum value can be found from linear interpolation:

$$T_m = V_m \cdot P_m \quad (6)$$

Here $V_m = T_{max}/P_{max}$ is the torque to pressure ratio of the motor, and it approximately equals the fluid volume corresponding to a rotor rotation of one radian. This is realized from the power balance equation $$T_m \Omega_m = \eta P_m Q \quad (7)$$

Here $\eta$ is an efficiency factor (less than unity) accounting for friction (in rotor and bearings) and fluid leakage between rotor and stator, and $\Omega_m$ is the angular velocity of the rotor relative to the stator. The product $P_m Q$ is the hydraulic input power while $T_m \Omega_m$ is the mechanical output power. From this equation we find that the ratio $V_m = T_m/P_m = \eta \cdot Q/\Omega_m = \eta \cdot V_{rad}$ where $V_{rad}$ is fluid volume needed to produce 1 rad angular displacement. If the mud motor is perfect with no losses, $V_m = V_{rad}$.

Step 3: Calculate String Twist From Mud Motor Torque.

An important parameter needed for calculating the string twist is torsional string compliance. Compliance is a measure of torsional elasticity and is the inverse of torsional stiffness. For a general non-uniform string, the formula for torsional compliance is $$C_t = \int_0^L \frac{dL}{GI_p} \quad (8)$$

Here G is the shear modulus of elasticity of the drill string material (most often steel), $I_p = (\pi/32) \cdot (D^4 - d^4)$ is the polar area moment of inertia, D and d being the outer and inner drill string diameters, respectively. Finally, L is the length of the drill string. For a string consisting of uniform sections, the integration can be substituted by a summation over all sections. A drill pipe section, which has different joint and body thicknesses, can be treated as uniform if the effective polar inertia moment is calculated from $I_{p,eff} = ((1-\lambda_j)/I_{body} + \lambda_j/I_{joint})^{-1}$, $\lambda_j$ being the relative length of joints, typically 0.05.

When the string compliance is determined, the static twist of the string exposed to the estimated mud motor torque is $$\theta_{twist} = C_t \cdot T_m \quad (9)$$

Step 4: Apply Twist Compensation

If the top of the string is not rotated after the off-bottom calibration tests, the string will be twisted and cause the tool face to rotate backwards (counter clockwise) when the bit is set on bottom and its torque load increases. The torsional friction along the string will hinder immediate rotation. Instead the friction will make the rotation dependent on the axial motion of the string. In the following, we shall assume that the wellbore friction is a Coulomb friction, meaning that the friction force is a vector anti-parallel to the speed direction but independent of speed magnitude. Then the twist rate, $d\theta_{twist}/dL$, is a function of axial motion and of the twist itself. It is useful to determine a twist relaxation length defined as the axial string displacement needed to reduce the non-equilibrium twist by a factor $1/e=0.37$. It can be shown that this twist relaxation length can be expressed by $$\Lambda = \int_0^L \mu_w f_n C_{tacc} r_c^2 dL = \lambda C_t T_w \bar{r}_c \quad (10)$$

Here $\mu_w$ is the wellbore friction coefficient, $f_n$ is the normal contact force per unit length, $C_{tacc}$ is the accumulated torsional string compliance (referred to the non-rotating point of the string), and $r_c$ is the contact radius. In the last expression, $T_w = \int \mu_w f_n r_c dL$ denotes the total wellbore friction torque needed to rotate the entire drill string off bottom, $\bar{r}_c$ is the (friction weighted) average contact radius, and $\lambda$ is a friction distribution factor. The latter is normally less than unity but equals unity in the special case when all friction is concentrated at the lower end of the drill string. It is worth noticing that the twist relaxation length is proportional to the torsional compliance and to the rotating off-bottom friction torque. Both factors grow roughly linearly with drill string length, implying that the twist relaxation length increases roughly proportionally to the drill string length squared.

If the axial string speed or the rate of penetration, represented by the general bit speed symbol $v_b$, is constant, then the twist relaxation length corresponds to a relaxation time $$\tau_\Lambda = \frac{\Lambda}{|v_b|} = \frac{\lambda C_t T_w \bar{r}_c}{|v_b|} \tag{11}$$

This relaxation time also grows proportionally to the string length squared. In comparison, the compressibility induced pressure time constant is roughly proportional to the inside fluid volume and it therefore grows roughly linearly with drill string length. In many cases, and especially for long strings and low penetration rates, the relaxation time far exceeds the pressure response time. In such cases, the pressure derivative term in equation (5) can be skipped without sacrificing accuracy of the twist compensation.

The above formulas apply when the string twist is built up by reactive reverse rotation of the bit and with no angular motion at the top of the string. On the contrary, if the top of the string is rotated forward by an angle equal to the equilibrium twist angle, the tool face will not change or rotate backwards as the mud motor is loaded. Instead, it will stay close to the initial tool face position. The tool face can, however, change slightly in a transient time interval because the initial torque distribution along the string is not perfectly constant as it is in the equilibrium state.

This top string rotation is called twist compensation and is a feed-forward coupling that improves the tool face control and reduces the problems of reactive tool face rotation and long relaxation times.

Step 5: Apply Normal Tool Face Feedback

Models may not be perfect, neither the estimates for the mud motor torque and for the string compliance. Therefore tool face control may include a feed-back loop that minimizes the difference between desired and observed tool face angles. Both P-type and PI-type controllers can be used. In the latter case, the set value for the top drive position can be expressed by $$\Phi_{set} = \Phi_0 + C_t T_m = P_\phi \phi_{err} + I_\phi \int \phi_{err} |v_b| dt \tag{12}$$

Here $\Phi_0$ is the reference angular position of the top drive (referred to a torque-less string off bottom), the second term is the twist compensation term, $\phi_{err} = \phi_{set} - \phi_{mwd}$ is the tool face error, $\phi_{set}$ and $\phi_{mwd}$ being respective the desired and measured tool face angles. The proportionality factor $P_\phi$ is dimensionless while integral factor $I_\phi$ has the dimension of inverse length. If, as a special case, the integral term is skipped ($I_\phi = 0$), the tool face error $\phi_{set} - \phi$ will be reduced exponentially by a factor 1/e after a penetration depth equal to $\Lambda/P_\phi$. The corresponding regulation time equals $\tau_\phi = \Lambda/(P_\phi |v_b|)$. To avoid instabilities due to measurement delay, this time constant should be considerably longer than the MWD measurement delay time $\tau_{mwd}$. This is equivalent of requiring that $P_{100} \ll \Lambda/(\tau_{mwd} |v_b|)$.

Simple P-control is sufficient to make the tool face reach the target angle asymptotically. An additional integral term will cause a temporary over-swing of the tool face, such that also the average tool face more rapidly reach the target. It can be shown that optimal over-swing without tail oscillations is obtained if the integration time constant is roughly twice the basic regulation time constant. That is, $I_\phi \approx 0.5 P_\phi/\Lambda$. Higher values increase the risk of oscillations and instabilities.

The inner control loop, which shall ensure that the actual orientation of the top string follows the set value, is not discussed in details here. It is assumed that servo control of the angular position is both accurate and quick, meaning that the angular control loop has time constants much shorter than the other time constants of the system. The angular position of the top string does not need an absolute datum position, only a relative one. This relative datum position should be set equal to the measured tool face when the bit is off bottom and the string is torque less, that is without a net residual twist. Any residual twist should first be removed by reciprocating the string axially, that is, by hoisting and lowering the string while no torque or angular motion is applied to the string. According to the analysis above, the necessary axial bit motion needed to remove the residual torque is a few twist relaxation lengths. The total gross motion may be longer because of the dynamic elastic stretch resulting from reversal of the motion direction. If the top-drive is made torque-less and free to rotate during this twist-removing procedure, the effective relaxation length (and time) is substantially shortened. This is because the twist pivoting point moves towards the frictional center point and thereby reduces the distribution factor $\lambda$ in equation 10.

As an example of setting the relative datum position, if the measured tool face of a torqueless string is 3 o'clock (90° from upwards position), the corresponding angular top drive position should be defined to be east (90° from north). The relative datum position of the angular drive mechanism must be set while the pumps are running, because fluid circulation and some minimum pressure drop across the bit is required for enabling the MWD mud pulse telemetry system. The accompanied motor and bit rotation will create a small residual torque, because the drill bit will have some small but finite side force. However, the corresponding residual twist does not affect the accuracy of the tool face control as long as it is constant.

Step 6: Control the Curvature Magnitude

Mathematically, the curvature of a smooth 3D curve is a vector defined as the derivative of the unit tangent vector with respect the measured depth. That is, c=dt/dL where the tangent vector can be written as t=(cos α sin θ, sin α sin θ, cos θ) and α and θ are azimuth and inclination angles, respectively. The magnitude of the wellbore curvature is often called "dogleg severity" in the drilling industry.

Because the curvature vector is always perpendicular to the tangent vector, it can also be uniquely represented by a 2D vector or, alternatively, by a scalar complex curvature $$c = c_0 e^{j\phi} \tag{13}$$

Here $c_0$ is the curvature amplitude, and $\phi$ is the tool face defined as the direction of the bend/bit rotation axis, relative the high side (12 o'clock position) in an inclined wellbore. The curvature amplitude $c_0$ is basically a property of the directional part of the BHA and strongly dependent on the magnitude of the bend angle and on the locations of the bend and the near-bit stabilizers. In the drilling industry it is commonly termed turn rate capacity but we shall here call it the assembly curvature. It may also be a function of the tool face itself, implying, for instance, that the dropping rate for a downwards tool face orientation $\phi = \pi$ can differ from the building rate of an upwards tool face $\phi = 0$. The assembly curvature may also have a small phase angle $\arg(c_0) \neq 0$ accounting for the fact that the true curvature direction may have an offset from the measured tool face direction. This directional offset may come from a combination of real effects caused by bit rotation or formation inhomogeneity and from an offset error in the tool face measurement.

The complex representation is especially useful for calculating the mean wellbore curvature when the tool face changes over the averaging interval. Explicitly, the average curvature over a certain time or drilling depth interval can be expressed by $$\langle c \rangle = \langle c_0 e^{j\phi} \rangle = \frac{\int v_{rop} c_0 e^{j\phi} dt}{\int v_{rop} dt} \quad (14)$$

Here $v_{rop}$ is the rate of penetration and the brackets $\langle \ \rangle$ denote depth based averaging. This formula is quite general and applies for finding both the mean curvature direction $\arg\langle c \rangle$ and the curvature magnitude $\text{abs}\langle c \rangle$ for any variation of the tool face.

It is also convenient to define a directivity factor to quantify both the relative reduction in curvature and the mean curvature direction:

$$\delta = \frac{\langle c \rangle}{\langle |c| \rangle} \approx \langle e^{j\phi} \rangle \quad (15)$$

The bars, ||, denote modulus of a complex number inside the bars. The last approximation is valid if $c_0$ is constant over the averaging depth interval. In general, the magnitude $|\delta| \leq 1$ while the mean curvature direction equals $\langle \phi \rangle = \arg\langle e^{j\phi} \rangle$.

A few classes and special cases of tool face variations are discussed below. For simplicity, it is presumed that both the penetration rate and the curvature amplitude are constant during the variation period. Also, it is presumed that the tool face rotation rate $\dot{\phi}$ is relatively slow, meaning that the tangential speed of the string is much lower that the axial speed given by the rate of penetration. In mathematical terms, $|\dot{\phi} \cdot \bar{r}_c| \ll v_{rop}$, where $\bar{r}_c$ was defined above in relation to equation (10). This limitation of the string rotation speed may be beneficial for improving the controllability of the tool face. Without this restriction the frictional torque and transient twist values could be so high that instant tool face control would be much more difficult.

One important class of curvature control methods is characterized by cyclic variations of the tool face angle, that is, the tool face is oscillated back and forth around its target direction. As a special example, if the tool face angle is oscillated linearly between the extremes $-\pi a$ and $+\pi a$, a being a normalized variation amplitude, then the mean complex curvature becomes $$\langle c \rangle = c_0 \delta \quad (16a)$$

where the directivity factor is real and equal to $$\delta = \frac{\sin(\pi a)}{\pi a} \quad (17b)$$

Hence the effective curvature magnitude is reduced in a controlled way while keeping the mean face curvature direction. A numerical example: if a=0.5 (the tool face oscillates ±90° around the mean position), the curvature is reduced by a factor 2/π=0.64, as compared with a static tool face.

Another class of methods for controlling both direction and magnitude of the curvature is to rotate the tool face more or less monotonically in one (normally clockwise) direction while varying rotation rate as a function of the measured tool face. One example is to keep the tool face constant at the target position for a certain period of time and then rotate the tool face clockwise an integer number of turns at a constant rotation rate. The magnitude of the directivity factor then equals the relative time at the preferred tool face direction. This mode resembles today's practice of toggling between rotary and sliding drilling, except that the assumed slow speed makes this a continuously sliding drilling method. Another variant of the rotation speed modulation method is represented by the following equation describing a continuous but modulated rate of tool face rotation.

$$\frac{d\varphi}{dt} = \Omega_\phi \cdot (1 - a \cdot \cos\phi) \quad (18)$$

Here $\Omega_\phi$ is the average angular rotation speed while a now represents a speed modulation factor. This is a non-linear differential equation that must be solved numerically to first find the instant tool face $\phi(t)$ and then the directivity factor $\delta = \langle e^{j\phi} \rangle$ as a function of the modulation factor. When this relation is found for a series of different modulation values, these values can be used to find the inverse function $a(\delta)$.

It can be difficult to know a priori the base assembly curvature $c_0$ representing the instant curvature relative to the tool face direction. Fortunately, it is possible to determine this curvature experimentally during the drilling process as briefly described in the following. From integration of the definition of the curvature, c=dt/dL, it follows that the directional change after drilling a certain distance is $$\Delta t = \int_L^{L+\Delta L} c \, dL = \langle c \rangle \Delta L.$$

Using scalar complex representation for both curvature and direction change we find that $\langle c \rangle \approx \langle c_0 \rangle \delta = \Delta t/\Delta L$ or $\langle c_0 \rangle \approx (\Delta t/\Delta L)/\delta$. If this assembly curvature is not purely real, it means that there is an angle difference between the measured tool face and the curvature direction it produces.

Reference is made to FIG. 1 showing vertical and horizontal projections of a deviated wellbore 1. It also shows the definition of the inclination angle θ and the azimuth angle α, with N and E being north and east, respectively. c denotes the curvature while t is the tangent vector. There are several methods, such as the balanced tangential method and the minimum curvature method, which can be used for transforming trajectory survey coordinates to Cartesian coordinates.

Figure 2:
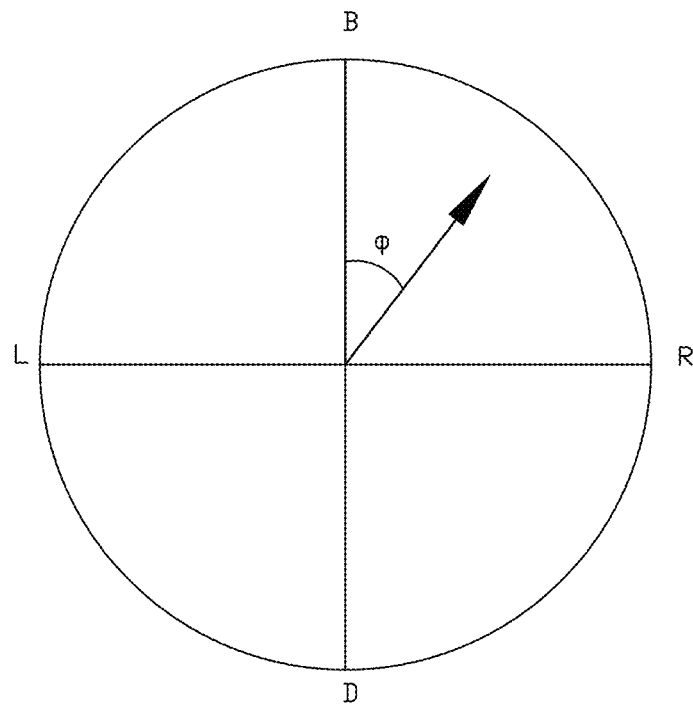
FIG. 2: shows a dial diagram visualizing the tool face angle.

FIG. 2 illustrates how the tool face $\phi$ can be regarded as a vector like the small handle of a circular watch. The angular positions B, R, D and L denote building (increasing inclination), right turn, dropping (decreasing inclination) and left turn positions, respectively. Tool face is therefore a unit vector describing the desired direction of the wellbore curvature, perpendicular to the current tangent vector of the wellbore axis. The magnitude of the curvature depends on many variables, such as the bend angle, the distance for bit to the bend, stabilizer positions, the flexural rigidity of the bottom hole assembly (BHA) and even the tool face.

Figure 3:
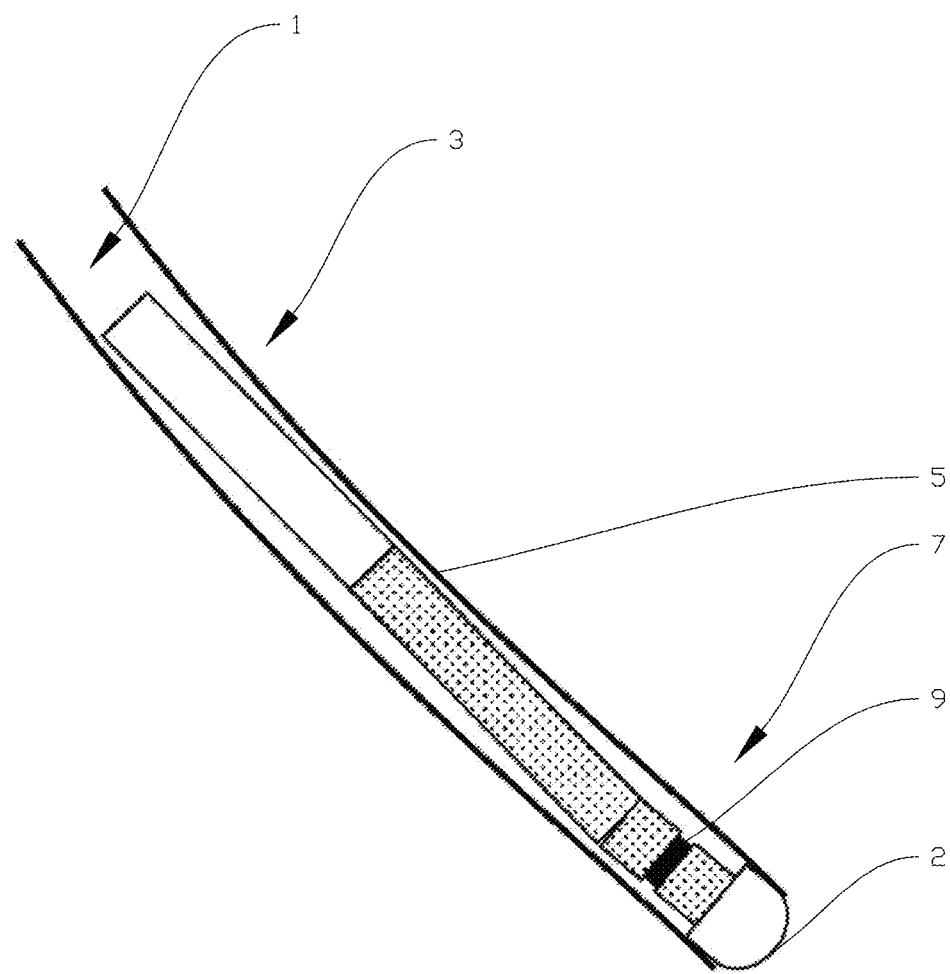
FIG. 3: shows a schematic view of a steerable bottom hole assembly comprising a mud motor with an integrated bend.

An illustration of a steerable assembly is given in FIG. 3. The wellbore 1 is being drilling in a formation by means of a drill bit 2 connected to the lower end of a drill string 3. A mod motor (PDM) 7 is provided above the drill bit 2 and comprises a surface adjustable bend 9. Between the lower end of the drill string 3 and the PDM 7, BHA is provided with a measurement while drilling (MWD) tool 5. The MWD tool 5 is adapted to measure, by means of accelerometers and magnetometers, the inclination and the azimuth angles of the tool itself, and the tool face angle. These measurement data are normally transmitted to surface by mud pulse telemetry to provide the necessary feedback to the directional driller, who is the person responsible for keeping the wellbore close to the planned trajectory. The low transmission bandwidth provided by mud pulse telemetry makes the measurement rates relatively slow, typically one measurement per 30 seconds.

Figure 4:
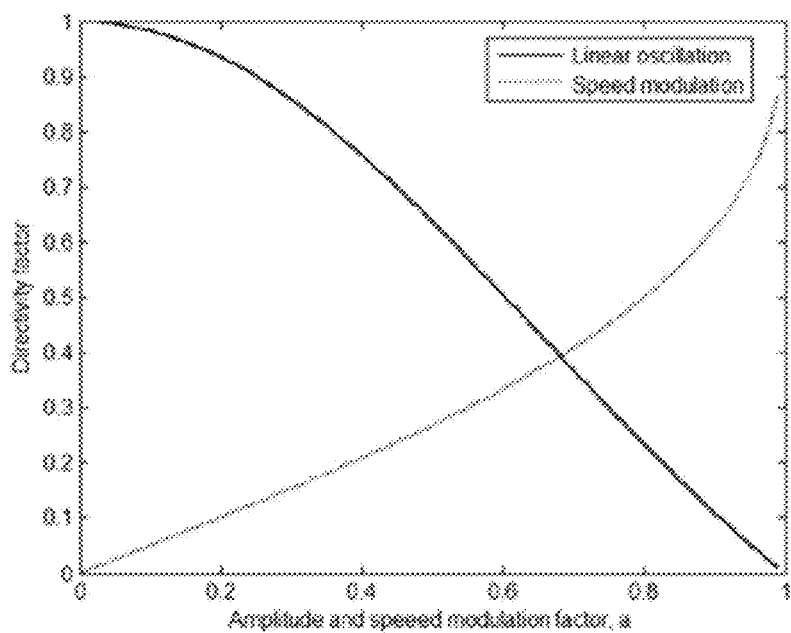
FIG. 4: shows directivity factors versus normalized oscillation amplitude and speed modulation.
Figure 5:
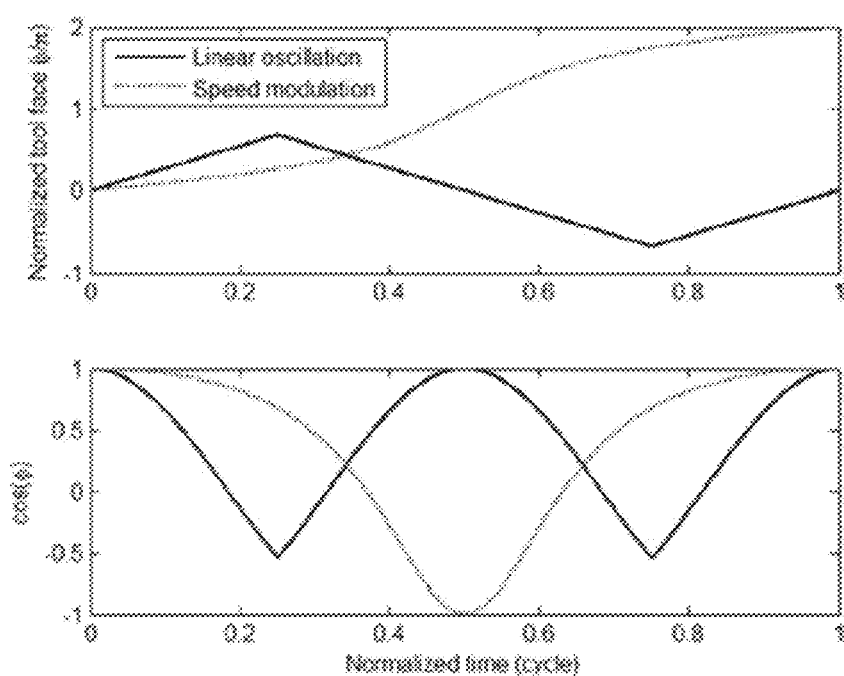
FIG. 5: shows an illustration of two methods of tool face variations, both giving a directivity factor of |δ|=0.394 at a modulation factor of a=0.681.

FIG. 4 shows the directivity factor for the special cases discussed above, as function of the normalized oscillation amplitude and speed modulation factor, respectively. We see that the methods are complementary in that a small oscillation amplitude gives a relatively high directivity while a small speed modulation gives a relatively low directivity. The two directivity factors match ($\delta$=0.394) when a=0.681. This special case is used for illustration of the two methods in FIG. 5. For simplicity, it is also assumed that the desired mean tool face is $\phi_{set}$=0. The upper subplot shows the normalized tool face angles versus time during one cycle, while the lower subplot shows how the cosine of tool face angles varies over the same period. The averages of the cosine curves (not shown explicitly) are equal to the common directivity factor 0.394.

The rotation rate modulation method has an advantage over the oscillation method in that it more effectively helps reducing the axial friction and thereby improves the bit load control. The higher the rotation rate and cycle frequency are, the more effective is the axial friction reduction. On the other hand, a higher rotation rate will increase the transient torque and make tool face control more difficult. The optimal rotating speed must therefore be determined as a compromise between two conflicting goals.

It can be argued that the proposed methods do not produce perfect wellbore curvature, because the curvature direction is varied. Mathematically this is true. In practice, however, the question of wellbore smoothness and tortuosity is a matter of length scale of the imperfections. It can be seen that the lateral departure from a perfect wellbore is the twice-integrated value of the curvature error. If we, for simplicity, assume that the curvature is varied in one plane so that it can be treated as a bipolar scalar function, then the lateral deviation can be written as $$\Delta R_{err} = \int_L^{L+L_c} \left( \int_L^{L+x} c_{err} dL \right) dx \approx \frac{1}{2} c_{err} \cdot L_c^2 \quad (19)$$

Here $L_c$ is the penetration length during one cycle. The last approximation is valid if the curvature error is constant. As an example, if the curvature error, defined as the difference between the actual curvature and the target curvature, is constant and equal to $c_{err}$=2 deg/30 m=0.0012 m$^{-1}$ and the penetration length per cycle equals 1 m, then the lateral error is only 0.6 mm. In contrast, assume that sliding and rotary drilling are used every second stand (a stand here means a group of three single pipes with a typical length 30 m). Also assume that the target inclination build rate is 2°/30 m while the sliding drilling produces 4°/30 m build rate (assembly curvature). The corresponding maximum lateral trajectory error then occurs in the transitions between the two modes and is equal to 0.5·0.0012·30$^2$ m=0.52 m. This is significant deviation that can cause excessive friction force, especially if a stiff casing string with small diameter clearance is run into the well during the completion phase.

Other Improvements

The twist compensation used as a feed-forward coupling does not require measured torque at the top of the string. Measurements of the top string torque, either directly by an integrated string torque sensor or indirectly from the top drive motor torque, are therefore optional. In a steady state condition, the top torque should be equal to the estimated mud motor torque. A steady state difference indicates that one or both measurements could have an offset error or a scaling error. A temporary difference, however, is an indication that the steady state condition is not reached and that the tool face is expected to change unless the bit torque load or the surface angular position is adjusted to close the torque gap. Therefore, a measured difference between down hole and surface torque can be used as an additional feed-forward loop that can improve response time and accuracy of the tool face control.

The transient twist due to uneven torque distribution along the string can also be reduced by applying a temporary under- or over-compensation. As an example, if MWD measurements show that the tool face temporarily rotates backwards (counter clockwise) when the mud motor load is increased and normal twist compensation is applied, it is possible to minimize this transient by applying a time limited feed-forward twist compensation that is higher than described above. This is just one of many possible examples of how the wellbore curvature control can be further improved by adaptive adjustment of control parameters.

There is an alternative way of estimating the pressure response time constant, which is based on the coupling between bit load and bit torque. Even though this coupling, in general, is neither constant nor linear, it can be treated as linear over limited time and depth intervals. That is, we assume that the change in bit torque is given by $$\Delta T_b = \mu_b \frac{d_b}{3} \Delta F_b \quad (20)$$

where $\mu_b$ is a normalized bit torque coefficient (a kind of bit/formation friction coefficient), $d_b$ is the bit diameter, and $\Delta F_b$ is the change in the bit force. The factor $d_b/3$ is the effective contact radius of the tool face when the average contact pressure of the bit face is independent on radius.

When the axial wellbore friction is neither too high nor too erratic, the bit load can be fairly well estimated from surface measurements as the difference between a reference hook load (off-bottom tare weight) minus the actual hook load. The load induced change in the bit torque will also cause an immediate change in the mud motor pressure and a delayed change in the differential pump pressure. Hook load and pump pressure are therefore two different dynamic responses of a change in the true bit load. While the hook load change is more or less a mirrored but slightly delayed reflection of the bit load, the pump pressure responds more like a 1$^{st}$ order low pass filtered version of the mud motor torque.

The dynamic relation between hook load and pump pressure can be modeled by a well-known technique called system identification. It is a statistical method that uses time series or frequency spectra from input and output variables to build a mathematical model of a dynamic system. (As a reference, see Mathwork's web pages on their System Identification Toolbox). The dynamic system to be modeled is called a black-box system if there is no a priori knowledge of the system and a grey-box system if the model structure is known but the model parameters are unknown. The grey-box case applies here, because we know that the pump pressure response is close to that of a low pass filter response:

$$H_{pw} = \frac{H_{pw0}}{\tau_{pw}s + 1} \quad (21)$$

Here $H_{pw0}$ is the low frequency amplitude ratio, $\tau_{pw}$ is the observed time constant and $s=j\omega$ is the Laplace variable, $j=\sqrt{-1}$ being the imaginary unit and $\omega$ the angular frequency.

Assume that the differential hook load (hook load based bit load estimate) and the differential pump pressure are measured over a substantial time interval including some significant changes of the bit load. Then the two unknown parameters $H_{pw0}$ and $\tau_{pw}$ can be determined by means of the system identification technique. Because the hook load based bit load is a delayed version of the true bit load, the measured time constant is the difference between the true response time and the hook load delay time, $\tau_w$. The latter is assumed to be approximately equal to the sonic transition time, which is much lower than the former. The corrected pressure response time therefore equals $$\tau_p = \tau_{pw} - \tau_w \quad (22)$$

Hence we have described two independent ways of determining this response time experimentally.

In addition to providing a quality check of the earlier estimated pressure response time, the hook load based method also provides valuable information on the bit torque/load ratio. This is realized from the fact that the low frequency amplitude ratio $H_{pw0}$ can be expressed as $$H_{pw0} = \frac{\mu_b d_b}{3V_{pdm}} \quad (23)$$

The only unknown parameter in this expression is the normalized bit torque coefficient $\mu_b$. Often $\mu_b$ is assumed to be a constant, but in general it is a function of many parameters, such as formation type, bit aggressiveness and bit condition (it drops with bit dullness). It can even change with mean bit load, when the bit torque is a non-linear function of bit load.

The above method can be used repeatedly to monitor the friction torque coefficient as a function of depth, bit load and rate of penetration. If the auto driller is working so perfectly that there are too small variations of the hook load and the pump pressures, one can let the computer based auto driller induce small perturbations to enhance the signal to noise ratio of the estimated parameters. Such perturbations should be relatively small but preferably contain a range of frequencies on both sides of the pressure response frequency, $1/(2\pi\tau_p)$. A chirp signal representing a variable bit load set point with a constant amplitude (typically 5% of mean load), and a frequency sweep is a good candidate for such perturbations.

Integration Into an Improved Auto Driller

The trajectory control methods described above can preferably be incorporated as an integral part of a new type of auto driller, more advanced than today's diff-P auto drillers. While the traditional diff-P auto drillers basically control the bit face indirectly via bit load and draw works motion, the new auto driller uses both draw works and top drive actively to control both the bit load and the tool face. Especially the feed-forward twist compensation offers enhanced flexibility and accuracy. Because good curvature control can be achieved also in transient phases when the pump rate and the bit torque are changed, the new auto driller can improve the rate of penetration through better utilization of the bit and mud motor capacities. A high drilling rate in the sliding mode will reduce the need for toggling between sliding and rotary modes thus also producing a smoother and more accurate well trajectory.

Another advantage of these new methods for improved trajectory control is that they do not require new sensors or actuators. It requires standard MWD service for directional measurements plus standard load and motion measurements of the surface machines: draw works, pumps and top drive. It applies equally well to fixed platform and to floating vessels, provided that the floating vessel has an adequate heave compensation system. The improvements are achieved by combining advanced mathematical models with analysis of standard surface drilling data. The method extracts and utilizes information already present, both in the surface drilling data and in the meta data for the drill string and the mud motor, but which has not be fully utilized before. This is not to say that extra or higher rates of downhole data would be of no value. Real-time, high rate data on directional data and bit load data would of course make the system much better through elimination or reduction of delay times and uncertainties inherent in the surface based estimates of downhole variables.

It should be noted that the above-mentioned exemplary embodiments illustrate rather than limit the claimed invention, and that those of ordinary skill in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The articles "a" or "an" preceding an element does not exclude the presence of a plurality of such elements.

The invention claimed is:

1. A method for controlling the direction of a wellbore trajectory during directional sliding drilling by means of a drill string having a drill bit rotatable, by means of a mud motor, around a drill bit rotation axis at its lower end, the direction of the drill bit rotation axis defining a tool face, the method comprising:
   a1) estimating a pressure drop across the mud motor by measuring a drilling fluid pressure, wherein the estimating includes consideration of any transient drilling fluid pressure;
   b1) utilizing the estimated pressure drop from step a1) to calculate the torque of the mud motor;
   c1) calculating a reactive twist angle of the drill string by multiplying the calculated torque from step b1) by the torsional drill string compliance, and
   d1) rotating the drill string, by means of a drill string rotation means, an angle substantially equal to but in the opposite direction of the calculated reactive twist angle and forward feeding the calculated reactive twist angle to a control loop of the drill string rotation means for instantly regulating the tool face.

2. The method according to claim 1, wherein step a1) further comprises the step of including a drilling fluid pressure response time, in order to account for mud compressibility, in the estimate of pressure drop across the mud motor for improving calculation of torque in step b1) and further improving the calculation of reactive twist angle in step c1).

3. The method according to claim 2, wherein step a1) further includes determining the drilling fluid pressure response time theoretically.

4. The method according to claim 2, wherein step a1) further includes determining the drilling fluid pressure response time experimentally.

5. The method according to claim 2, wherein step a1) further includes using an assumed linear coupling between drill bit torque and drill bit load for estimating the drilling fluid pressure response time.

6. The method according to claim 2, wherein step a1) further includes utilizing a low-pass filter to filter out high-frequency components of a derivative of the drilling fluid pressure.

7. The method according to claim 2, wherein step c1) further includes estimating the torsional drill string compliance by means of the shear modulus of elasticity and the geometric dimensions of the drill string.

8. The method according to claim 1 further comprising measuring a downhole drill string torque and a surface drill string torque, and using any difference between the measured string torques as an additional feed-forward input to the control loop of the drill string rotation means, d1) rotating the drill string, by means of a drill string rotation means, an angle substantially equal to but in the opposite direction of calculated the reactive twist angle.

9. The method of claim 1, further comprising:
measuring the actual tool face and transmitting the measured actual tool face to the surface;
comparing the measured tool face to a desired tool face; and
using said measured tool face in the closed loop feedback to the drill string rotation means so as to reduce the error between the desired and the measured tool face.

10. The method according to claim 1, further comprising reducing the magnitude of the curvature of the wellbore by varying the tool face around a set direction.

11. The method according to claim 10, further comprising magnitude of the curvature of the wellbore by cyclic variation of the tool face.

12. The method according to claim 10, further comprising the step of controlling the magnitude of the wellbore curvature by rotating the tool face substantially monotonically in one direction while varying the rotation rate as a function of a measured tool face.

13. The method according to claim 12, further comprising keeping the tool face constant for a certain period of time and subsequently rotating the tool face an integer number of turns at a constant rotation rate.

14. The method according to claim 10, further comprising controlling the magnitude of the wellbore curvature by rotating the tool face continuously at a modulated rate.

15. A system for controlling the direction of a wellbore trajectory during directional drilling comprising: a drill string having a drill bit rotatable, by means of a mud motor, around a drill bit rotation axis at its lower end, the direction of the drill bit rotation axis defining a tool face; and a control unit adapted to execute the method of claim 1.

* * * * *